(12) United States Patent
Strang et al.

(10) Patent No.: US 7,075,031 B2
(45) Date of Patent: Jul. 11, 2006

(54) METHOD OF AND STRUCTURE FOR CONTROLLING ELECTRODE TEMPERATURE

(75) Inventors: Eric J. Strang, Chandler, AZ (US); Andrej Mitrovic, Phoenix, AZ (US); Jim Fordemwalt, Chandler, AZ (US); Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 227 days.

(21) Appl. No.: 10/399,981

(22) PCT Filed: Oct. 24, 2001

(86) PCT No.: PCT/US01/27781

§ 371 (c)(1),
(2), (4) Date: Apr. 24, 2003

(87) PCT Pub. No.: WO02/34457

PCT Pub. Date: May 2, 2002

(65) Prior Publication Data

US 2004/0011770 A1    Jan. 22, 2004

Related U.S. Application Data

(60) Provisional application No. 60/242,714, filed on Oct. 25, 2000.

(51) Int. Cl.
*B23K 9/00* (2006.01)
(52) U.S. Cl. .................... 219/121.52; 219/121.43; 156/345.47; 156/345.27; 118/723 I
(58) Field of Classification Search ......... 219/121.52, 219/121.43, 121.41, 121.36; 118/724, 725; 156/345.23, 345.27, 345.47
See application file for complete search history.

(56) References Cited

U.S. PATENT DOCUMENTS

| | | | |
|---|---|---|---|
| 4,201,579 A | 5/1980 | Robinson et al. | |
| 5,215,619 A | 6/1993 | Cheng et al. | |
| 5,487,786 A | 1/1996 | Chida et al. | |
| 5,824,158 A | 10/1998 | Takeuchi et al. | |
| 5,895,596 A | 4/1999 | Stoddard et al. | |
| 6,101,969 A | 8/2000 | Niori et al. | |
| 6,197,246 B1 | 3/2001 | Niori et al. | |
| 6,214,740 B1 | 4/2001 | Imai et al. | |
| 6,278,089 B1 | 8/2001 | Young et al. | |
| 6,838,833 B1 * | 1/2005 | Arai et al. | 315/111.21 |

* cited by examiner

*Primary Examiner*—Mark Paschall
(74) *Attorney, Agent, or Firm*—Oblon, Spivak, McClelland, Maier & Neustadt, P.C.

(57) ABSTRACT

A method of and a structure for controlling the temperature of an electrode (4). The electrode is heated prior to etching the first wafer and both a (temporally) stationary and a (spatially) homogeneous temperature of the silicon electrode are maintained. Resistive heater elements (1) are either embedded within the housing of the electrode (3) or formed as part of the electrode. The resistive heater elements form a heater of a multi-zone type in order to minimize the temperature non-uniformity. The resistive heater elements are divided into a plurality of zones, wherein the power to each zone can be adjusted individually, allowing the desirable temperature uniformity of the electrode to be achieved. Preheating the electrode to the appropriate operating temperature eliminates both the "first wafer effect" and non-uniform etching of a semiconductor wafer.

28 Claims, 9 Drawing Sheets

METHOD OF AND STRUCTURE FOR CONTROLLING ELECTRODE TEMPERATURE

CROSS REFERENCE TO RELATED APPLICATIONS

The present application is related to applications entitled "Multi-Zone Resistance Heater," U.S. Provisional Ser. No. 60/156,595 filed Sep. 29, 1999; and PCT/US00/25503, entitled "Multi-Zone Resistance Heater," filed Sep. 18, 2000. Each of those applications is herein incorporated by reference in its entirety.

BACKGROUND OF THE INVENTION

1. Field of the Invention

The present invention generally relates to a method of and a system for controlling uniformity when etching semiconductor wafers, and more particularly to a method of and a system for controlling a temperature of an electrode (e.g., an electrode of any of: silicon, anodized aluminum, carbon and silicon carbide).

2. Discussion of the Background

Plasma systems for the etching of silicon process wafers are in widespread usage. In some embodiments, such plasma systems have an electrode plate attached to the upper electrode surface for two primary purposes: (1) to present a surface of a material compatible with the process specific chemistry; and (2) to act as a source for scavenging species in the plasma For example, in some applications where an oxide film is etched from a surface of a semiconductor wafer, RF power is applied to the plasma from an upper aluminum electrode, through a silicon electrode plate. The silicon electrode plate enhances the selectivity of oxide-to-silicon etching because when the silicon electrode plate is bombarded by high energy ions from the plasma, silicon is introduced into the system. The silicon subsequently scavenges fluorine radicals and in doing so, the selectivity of the etching of oxide to the etching of silicon can be improved.

Known plasma etchers using silicon electrodes to achieve good selectivity of oxide-to-silicon etching have the silicon electrodes heated by the energy imparted thereto from the RF plasma However, a drawback of such etchers is that the selectivity of the oxide-to-silicon etch is very sensitive to the temperature of the silicon plate. Since the silicon plate in some reactors is heated only by the energy imparted thereto by the plasma, the heat-up time for the silicon plate to reach steady-state conditions is generally long, especially when compared to the relatively short etch time. Therefore, it takes several semiconductor wafers to be etched before the silicon electrode reaches the appropriate temperature for steady-state conditions. This results in the undesirable so-called "first wafers effect," wherein the first wafers to be etched are unusable thereafter because the silicon electrode has not been heated to a temperature where it is fully effective.

Historically, a solution to the "first wafers effect" has been to run "dummy" wafers through the system to bring the electrode up to the desired operating temperature before committing device wafers to the process. However, this solution is wasteful of silicon material, time, throughput of the machine, and money.

Another solution has been to use heaters to heat the process wafer in the plasma chamber. For example, the stripping of photoresist by hydrogen plasma, which heats the process wafer to a temperature of between 100° C. and 225° C., is disclosed in U.S. Pat. No. 4,201,579. On the other hand, U.S. Pat. No. 5,215,619 discloses the heating of the anode surfaces (i.e., both the walls and the gas manifold) to achieve a high etching rate and in-situ self-cleaning capability. U.S. Pat. No. 5,487,786 (hereinafter "the '786 patent") discloses heating of a high frequency application electrode to reduce the formation of silicon powder contamination during the chemical vapor deposition of silicon-hydrogen (Si—H). However, the electrode heaters of the '786 patent are in two parts, wherein a first part is an annular ring clamped to the edge of the front side of the electrode and the second part is physically separated from, but in close proximity to, the sides and back of the electrode.

Another drawback of conventional plasma etch apparatus and methods is that there is often poor thermal contact between the electrode and the upper electrode structure. Because of the poor thermal contact between the electrode and the upper electrode structure, the temperature of the electrode may not be uniform. Typically, the electrode exhibits strong temperature non-uniformities, particularly a strong radial temperature gradient, which will cause an undesirable radial etching non-uniformity resulting in non-uniform etching on the process wafers.

Thus, both the "first wafers effect" and the "non-uniform etching effect" cause significant undesirable problems for wafer-to-wafer uniformity and spatial uniformity of the etch rate and etch selectivity.

SUMMARY OF THE INVENTION

The present invention relates to a method of and a structure for quickly heating up an electrode (preferably a consumable electrode (e.g., a silicon, anodized aluminum or silicon carbide electrode) wherein the erosion of the electrode is sensitive to temperature) prior to the first wafer to be etched, and maintaining both a (temporally) stationary and a (spatially) homogeneous electrode temperature. This is accomplished by either embedding resistive heater elements within a housing containing an upper electrode or recessing resistive heater elements in the electrode so that the resistive heater elements (e.g., formed across multiple zones) are flush with the upper flat surface of the electrode. By preheating the electrode to the appropriate operating temperature, the "first wafer effect" can be eliminated along with its corresponding non-uniform etching of a semiconductor wafer. Further, by utilizing a multi-zone type heater, the temperature non-uniformity can be minimized.

A multi-zone heater embodiment of the present invention ameliorates both the first wafer effect and the non-uniform temperature effect of the electrode. The first wafer effect is ameliorated because the electrode is heated to the desired temperature prior to beginning to etch the first wafer. The non-uniform temperature is ameliorated because multi-zone heaters enable the power to each zone to be adjusted individually. Such a (multi-zone) heater can be achieved (1) using a heater integrated with the electrode or (2) using the electrode as a heater itself.

A first embodiment of the present invention uses at least one resistive electrode heater element to preheat the electrode(s) in a plasma or reactive ion etching system such that the temperature of the electrode(s) is stable and constant throughout the entire etching cycle. A second embodiment of the present invention uses at least one diffused region in the electrode(s) as the heating element(s) to provide the preheating and temperature controlling functions.

Another object of the present invention is to monitor the temperature of the electrode(s). Such an object is addressed by including temperature sensing elements in the heater/ electrode system. According to one aspect of the present invention, diffused p-n junction diodes are fabricated in the electrode(s) as the temperature sensing elements.

BRIEF DESCRIPTION OF THE DRAWING FIGURES

A more complete appreciation of the present invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 1A:
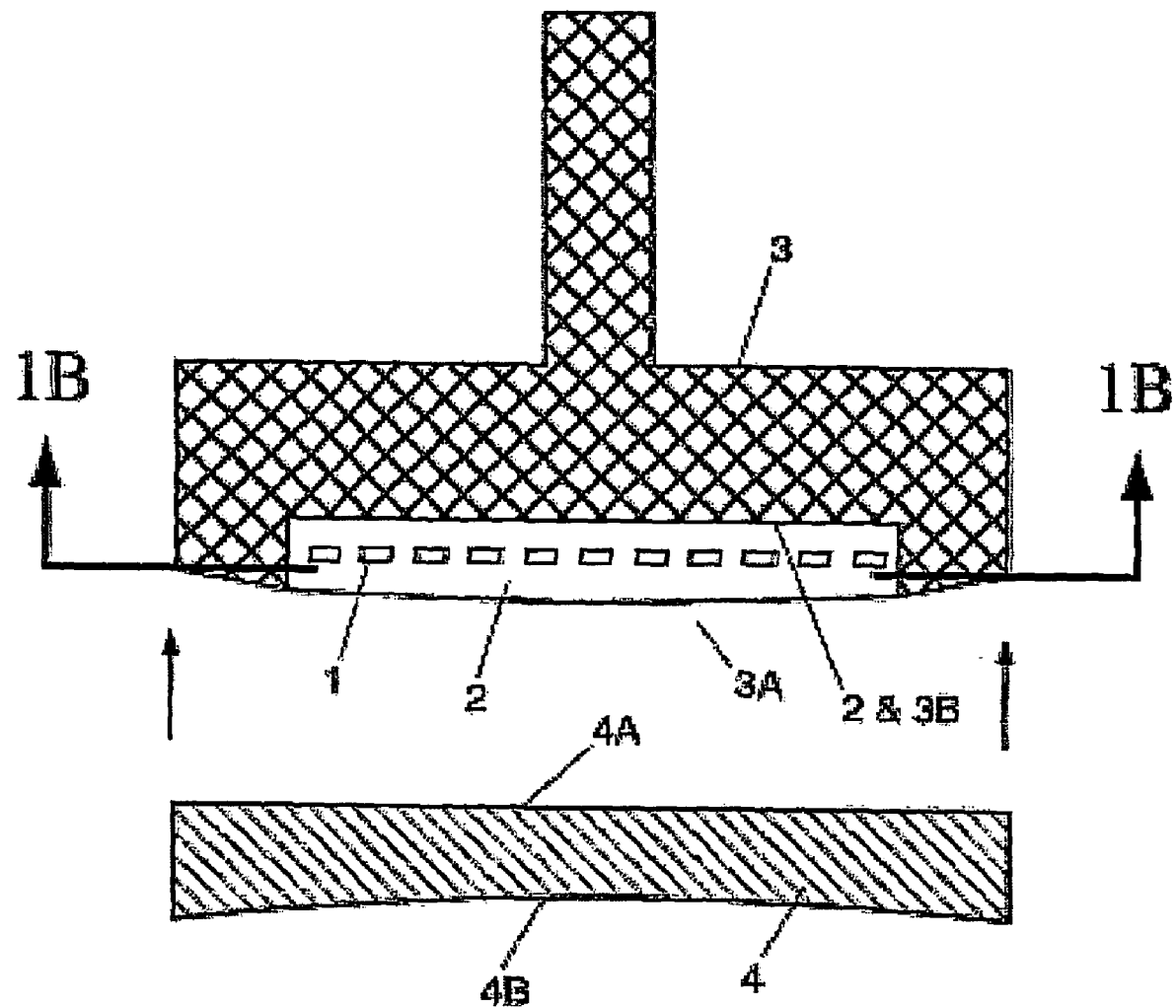
FIG. 1A is a cross-sectional view of a first embodiment of the present invention showing an upper electrode structure, wherein the upper electrode structure includes an inset plate with resistive heater elements embedded therein.

Referring to the drawing figures, like reference numerals designate identical or corresponding parts throughout the several views. FIG. 1A illustrates a first embodiment of the present invention, in which resistive heater elements 1 are embedded in a plate 2 (e.g., made of quartz, alumina or generally an electrically insulating material that has a low coefficient of thermal expansion and is compatible with an etch process). In turn, the plate 2 is inset in and affixed to an electrode housing 3. The electrode housing 3 is made of metal (e.g., aluminum) and it is machined with an inset to receive the plate 2. Furthermore, the outer edge of electrode housing 3 is machined with a slight convexity in order to be flush with the convexity of the bottom surface 3A of plate 2. As stated, the plate 2 is machined so that a bottom surface 3A thereof has a slight convexity (e.g., approximately 0.025 to 2 millimeters). An electrode 4 (e.g., an electrode of any of: silicon, anodized aluminum, carbon and silicon carbide) is attached to the integrated housing 3 and the plate 2 structure (e.g. by bolts at several locations about the periphery of the electrode 4) such that the upper surface 4A of electrode plate 4 is pressed against the bottom surface 3A of the plate 2. The electrode 4 has a flat upper surface 4A facing the convex bottom surface 3A of the housing 3 and a slightly concave bottom surface 4B. The convexity of the bottom surface 3A of plate 2 and the flatness of the upper surface 4A of electrode 4 create a spatially homogeneous mechanical pressure between the two surfaces when the electrode 4 is pressed against the plate 2 and attached to the electrode housing 3. This resultant mechanical pressure leads to an improved physical, thermal and electrical contact between the two surfaces.

Figure 1B:
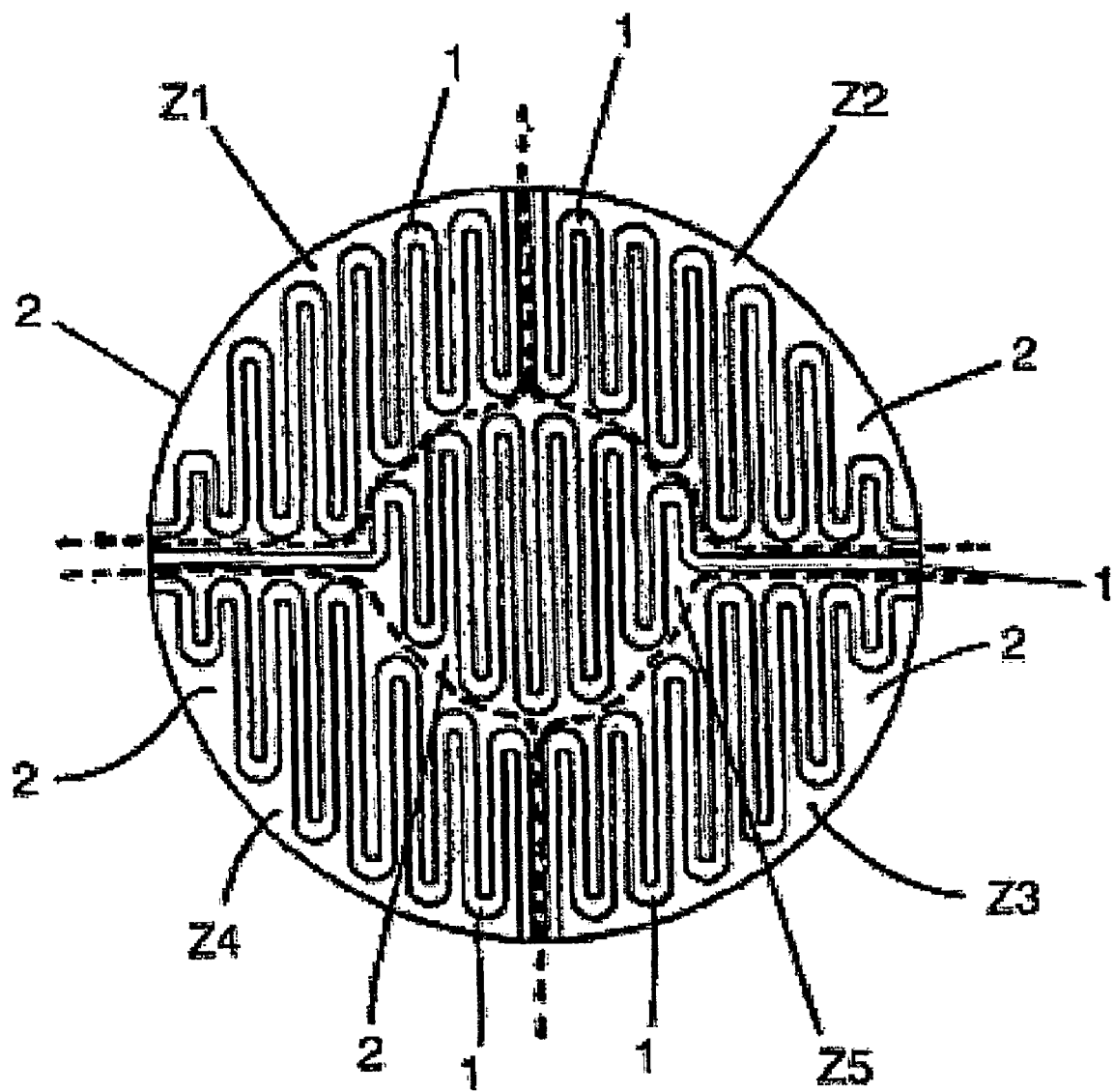
FIG. 1B is a cross-sectional view taken through line 1B—1B of FIG. 1A showing a first embodiment comprising a five-zoned pattern for the resistive heater elements embedded within the plate.

FIG. 1B is a cross-sectional view through line 1B—1B of FIG. 1A. FIG. 1B illustrates a preferred pattern of the resistive heater elements 1 embedded within the plate 2. The preferred pattern of the resistive heater elements 1 includes five different zones Z1, Z2, Z3, Z4, and Z5. Zones Z1–Z4 are outer zones and zone Z5 is an inner zone. The boundaries of the five zones Z1–Z5 are shown in FIG. 1B by dashed lines. Each of the resistive heater elements 1 in one of the five zones Z1–Z5 is supplied with power from a separate power source (not shown). By adjusting the power to each of the zones Z1–Z5, the temperature of each zone Z1–Z5 can be controlled independently. Thus, the desired temperature and temperature uniformity of the electrode 4 can be achieved. Furthermore, an RF filter or an RF choke (see FIG. 6) can be employed to isolate the power supplied to the resistive heater elements 1 of each of the zones Z1–Z5 from RF energy supplied to a plasma.

Figure 1C:
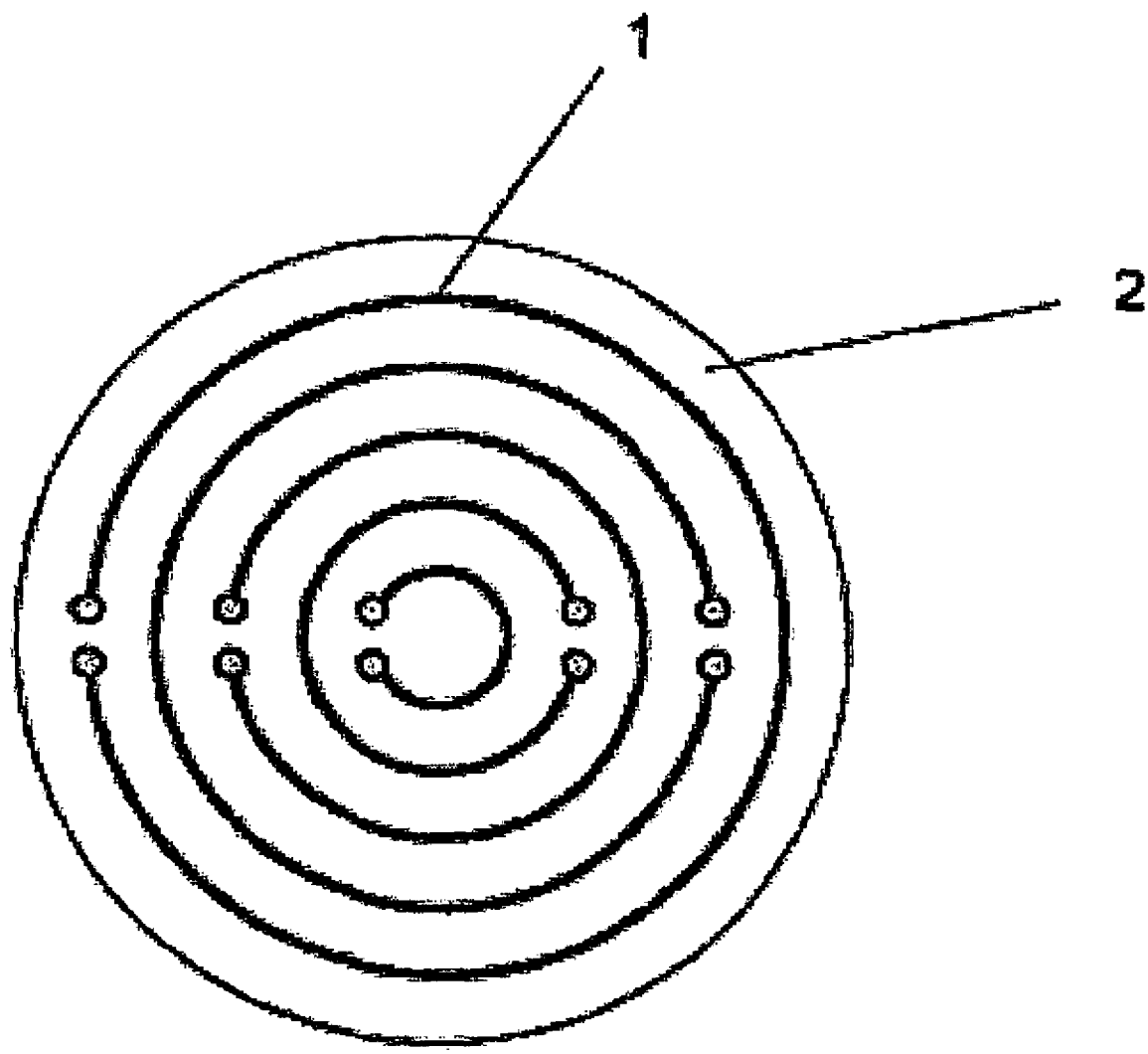
FIG. 1C is a cross-sectional view taken through line 1B—1B of FIG. 1A showing a second embodiment comprising a five-zoned concentric ring pattern for the resistive heater elements embedded within the plate.

A second configuration of the heater elements 1 can take the form of a ring pattern wherein a multiplicity of concentric ring heating elements include a multiplicity of radial heating zones. For instance, FIG. 1C presents a concentric ring heating configuration with 5 radial heating zones, wherein the contacts for each concentric ring heating element are alternately rotated 180 degrees between adjacent rings to permit a more azimuthally symmetric design. In fact, the preferred contact rotation may be every 72 degrees. The design shown in FIG. 1C can permit highly resolved radial control of the electrode temperature; however, it would lack control of azimuthal temperature variations.

As stated above, the slight convexity of the bottom surface 3A of the plate 2 and the electrode housing 3 permits good thermal contact between the electrode 4 and the plate 2 having the resistive heater elements 1 embedded therein. When the flat back side 2A of the plate 2 is pressed against and attached to the inner surface 3B of the electrode housing 3, a good spatially homogeneous thermal contact can be achieved as a result of applied mechanical pressure. Further, when the flat upper surface 4A of the electrode 4 is pressed against the resultant convex surface 3A of the plate 2 and the electrode housing 3, a good spatially homogeneous thermal contact is also achieved. The slight concavity of the bottom surface 4B of the electrode 4 compensates for bending when the electrode 4 is pressed against the convex bottom surface 3A of the plate 2 and the electrode housing 3.

Figure 2:
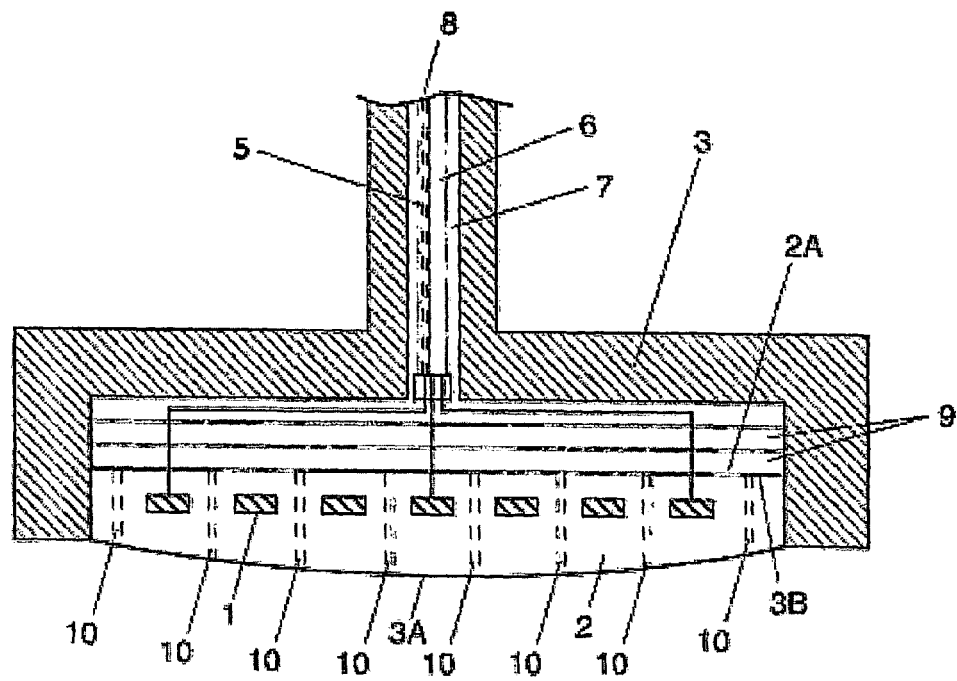
FIG. 2 is a cross-sectional view of a first variation of the first embodiment of the present invention showing the details of the housing.

FIG. 2 shows a first variation of the first embodiment of the present invention, wherein direct current or DC power is communicated to the resistive heater elements 1. For example, an electrical conduit 5 may be passed along side of a gas conduit 6 through a RF transmission feed 7 at the top of the electrode housing 3 as shown in FIG. 2. Wires 8, as illustrated by dashed lines, may be passed through the electrical conduit 5 and also through gas baffle plates 9 located between the inner surface 3B of the housing 3 and the flat back side 2A of the plate 2. The wires 8 may be connected directly, such as by soldering, to the resistive heating elements 1 embedded in the plate 2. Furthermore, for gas distribution to the processing chamber (see FIG. 7), the plate 2 has a plurality of gas orifices 10 as shown in cross-section in FIG. 2 by dashed lines.

The temperature of the plate 2 and the resistive heater elements 1 within each of the five zones $Z_1$–$Z_5$ is regulated, (e.g., by monitoring the resistance of each of the resistive heating elements 1 and then sensing the temperature as a result of the dependence of the material resistivity).

Figure 3:
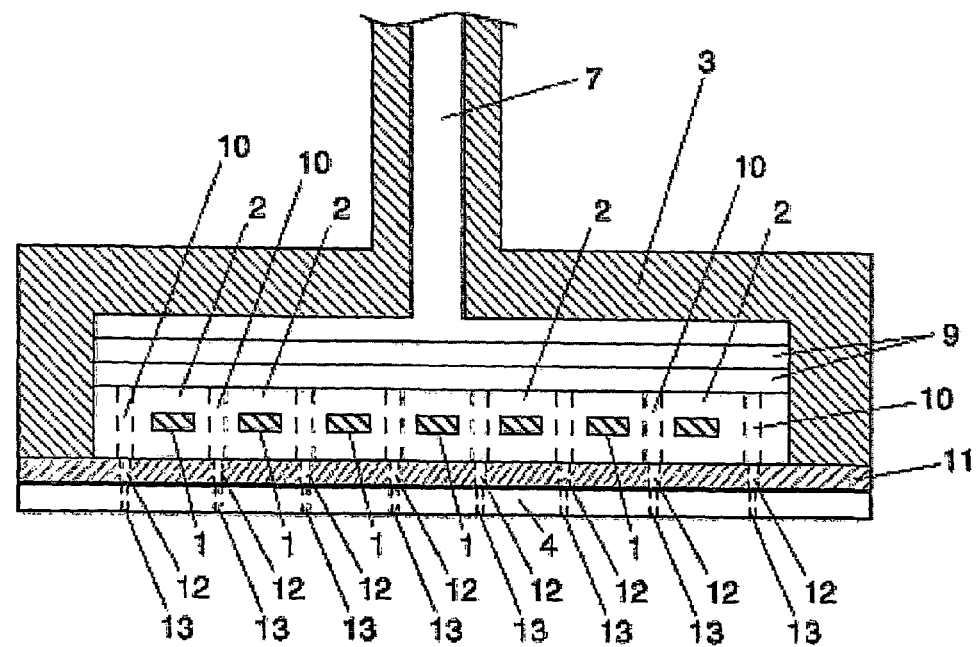
FIG. 3 is a cross-sectional view of a second variation of the first embodiment of the present invention showing the details of the housing, wherein the plate is separated from the electrode by a metal (e.g., aluminum) electrode plate.

FIG. 3 illustrates a second variation of the first embodiment of the present invention, wherein the plate 2 is entirely embedded within the electrode housing 3 via an aluminum electrode plate 11. Thus, the aluminum electrode plate 11 separates the plate 2 from the electrode 4. The gas orifices 10 through the plate 2 are aligned with corresponding smaller orifices 12 through the aluminum electrode plate 11, which in turn are aligned with correspondingly smaller orifices 13 through the electrode 4 as shown in FIG. 3. This arrangement of smaller and smaller orifices 10, 12 and 13 allows for the passage of gas through a showerhead inject plate to the processing chamber (see FIG. 7). The electrical connections of the second variation of the first embodiment of the present invention shown in FIG. 3 are similar to the electrical connections of the first variation of the first embodiment of the present invention shown in FIG. 2.

Figure 4A:
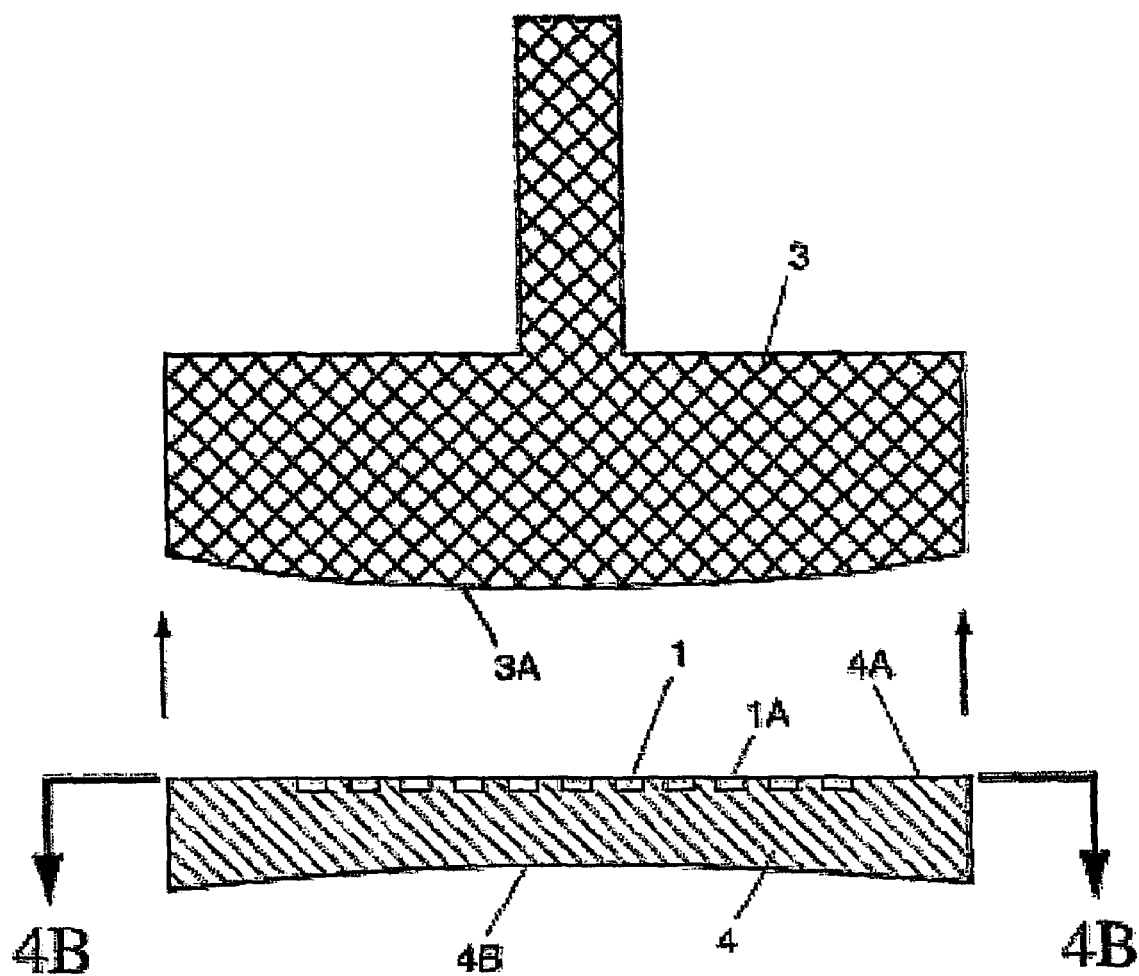
FIG. 4A is a cross-sectional view of the second embodiment of the present invention showing the housing opposite an electrode in which the resistive heater elements are recessed so as to be flush with the upper surface of the electrode.

Referring to FIG. 4A, a second embodiment of the present invention is shown, wherein resistive heater elements 1 are recessed in the electrode 4 so that the top surface 1A of the resistive heater elements 1 are flush with the top flat surface 4A of the electrode 4. The electrode housing 3 is preferably made of aluminum and has a slightly convex bottom surface 3A. However, unlike the first embodiment shown in FIGS. 1A, 2, and 3, the electrode housing 3 of the second embodiment has no plate inset therein and attached thereto.

Figure 4B:
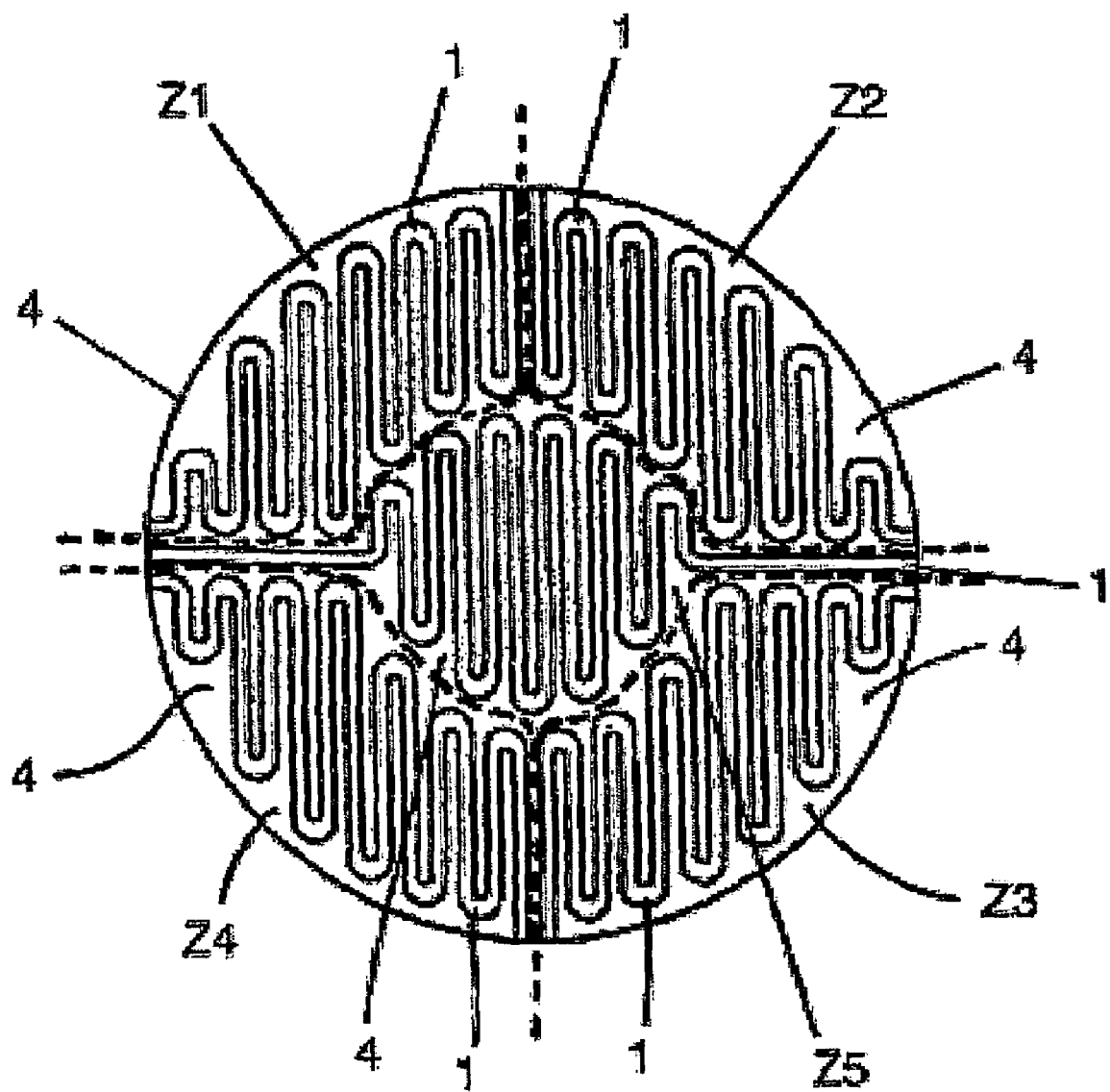
FIG. 4B is a cross-sectional view taken through line IVB—IVB of FIG. 4A showing the five-zoned pattern of the resistive heater elements embedded in the electrode similar to that shown in FIG. 1B.

FIG. 4B is a cross-sectional view through line IVB—IVB of FIG. 4A. Similar to FIG. 1B of the first embodiment of the present invention, FIG. 4B illustrates a preferred pattern of the resistive heater elements 1 which is the same as that described for FIG. 1B above. However, a concentric ring pattern may also be employed as shown in FIG. 1C where greater radial control is preferred and azimuthal asymmetries are negligible.

Figure 5:
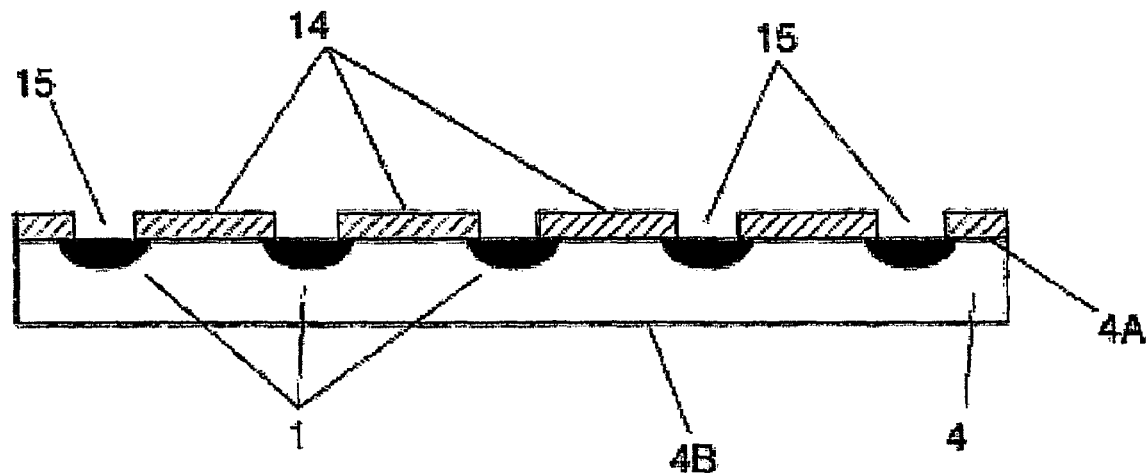
FIG. 5 is a cross-sectional view of the second embodiment of the present invention through the electrode plate showing either P- or N-type diffused resistive heater elements recessed in the electrode so as to be flush with the upper surface of the electrode and openings in the silicon oxide coating the electrode.

FIG. 5 illustrates a partial cross-section through the electrode 4 of FIG. 4B. The electrode 4 has diffused resistive heater elements 1 which are doped either P- or N-type. The resistive heater elements 1 are recessed in the top flat surface 4A of the electrode 4 of the second embodiment of the present invention to function similarly to the resistive heating elements 1 embedded in the plate 2 of the first embodiment of the present invention. The recessing of the resistive heater elements 1 so as to be flush with the top surface 4A of the electrode 4 may be done by oxide masking and diffusion.

The temperature of the electrode is preferably controllable. First, the electrode 4 is oxidized to form a thin (e.g., approximately 1 micrometer thick) $SiO_2$ layer 14. Then, the semiconductor wafer (see FIG. 6) is coated with a photo-resist using standard photo-resist techniques, such as spin coating. The pattern of the resistive heater elements 1 is then exposed using a mask having the appropriate pattern for the resistive heater elements 1. The pattern of the resistive heater element is etched into the $SiO_2$ oxide layer 14 using either wet or dry etch techniques. After etching the pattern into the oxide and removing the photo-resist the appropriate impurity (from either a Group III element or a Group V element) is diffused into the electrode 4 through the openings 15 in the $SiO_2$ oxide layer 14. Suitable metallic contacts may then be made to the diffused regions in order to provide the means for applying DC power to the resistive heating elements 1.

The resistance of the resistive heater elements 1 may be controlled by means of controlling the time and temperature of the diffusion. Since the control of the actual temperature of the electrode 4 is important, it should be possible to form an array of p-n junction diodes at the same time as the fabrication of the resistive heating elements 1, possibly using an extra process step. The forward voltage drop of the diodes, Vf, which is very predictably a function of temperature, could be used to monitor temperature.

Due to the inherent physics of silicon as a semiconductor wafer, and depending on the doping level of the electrode, this system would have an absolute upper limit of operation of 300 C. (575 K). The second embodiment of the present invention may have an operability issue because of the inherent upper limit of the operating temperature being about 300 C. as a result of the physics of using a semiconductor as a heater. However, the 300 C. upper limit is above the normally desired operating temperature and therefore, should not be a limitation.

Figure 6:
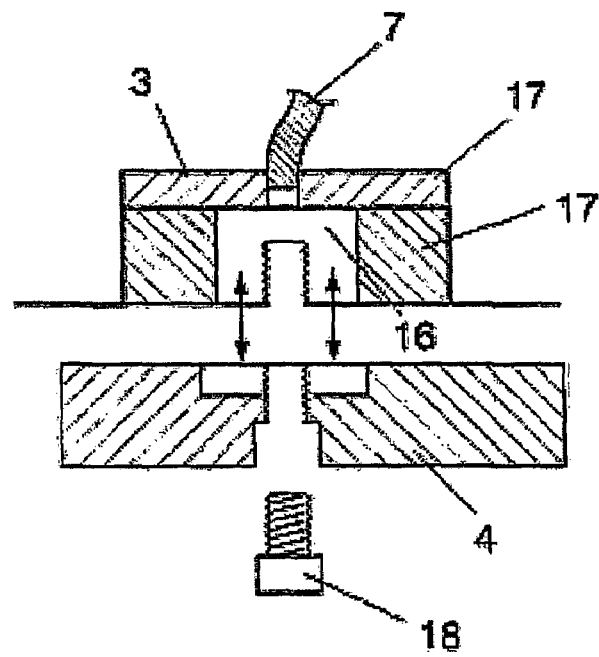
FIG. 6 is a cross-sectional view of the second embodiment of the present invention showing the use of a bolt to connect wires passed through the RF transmission feed of the upper electrode to contact surfaces with the electrode.

As in the first embodiment, electrical connection of the DC power supplies to the resistive heater elements 1 are provided. Wires (not shown) are passed through the RF transmission feed 7 of the upper electrode housing 3 to contacts 16 located adjacent to the surface in contact with the electrode 4 as shown in FIG. 6. The contacts 16 and wires (not shown) are insulated from the surrounding conducting structure via insulation 17. A bolt 18 connecting the electrode 4 to the electrode housing 3 may force contact between the aligned contacts 16 in the electrode housing 3 and electrode 4.

Figure 7:
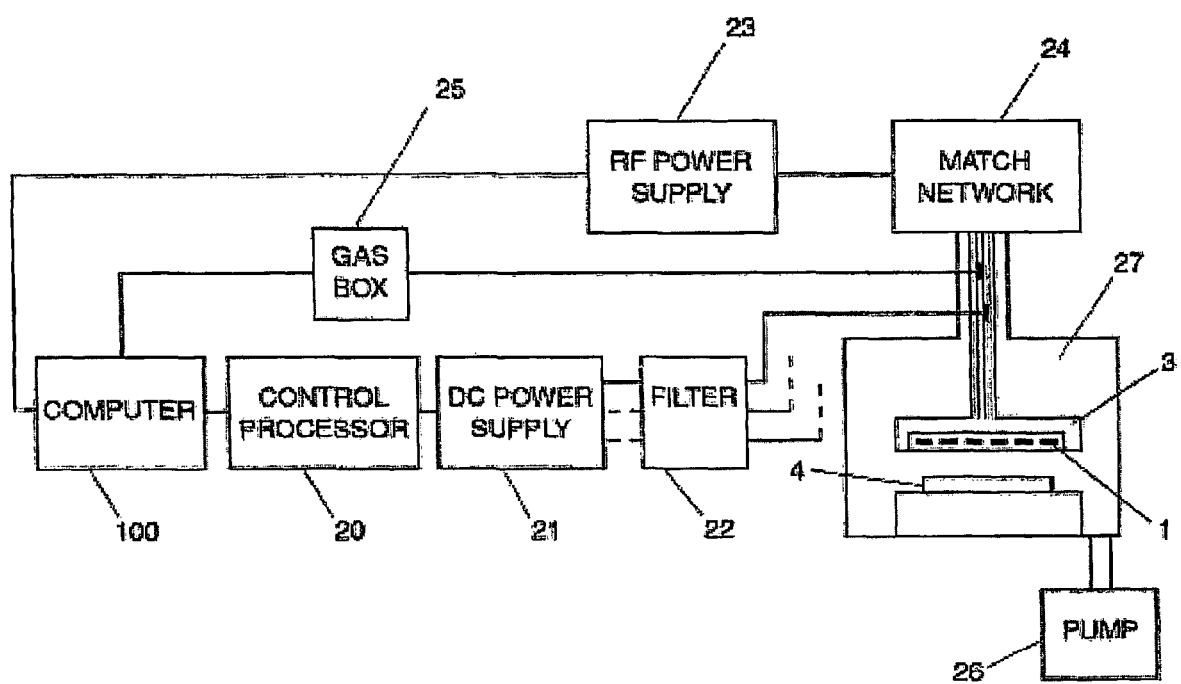
FIG. 7 is a schematic showing a housing and electrode/semiconductor wafer within a processing chamber which is connected to a centralized computer for controlling numerous functions of the wafer etching process.
Figure 8:
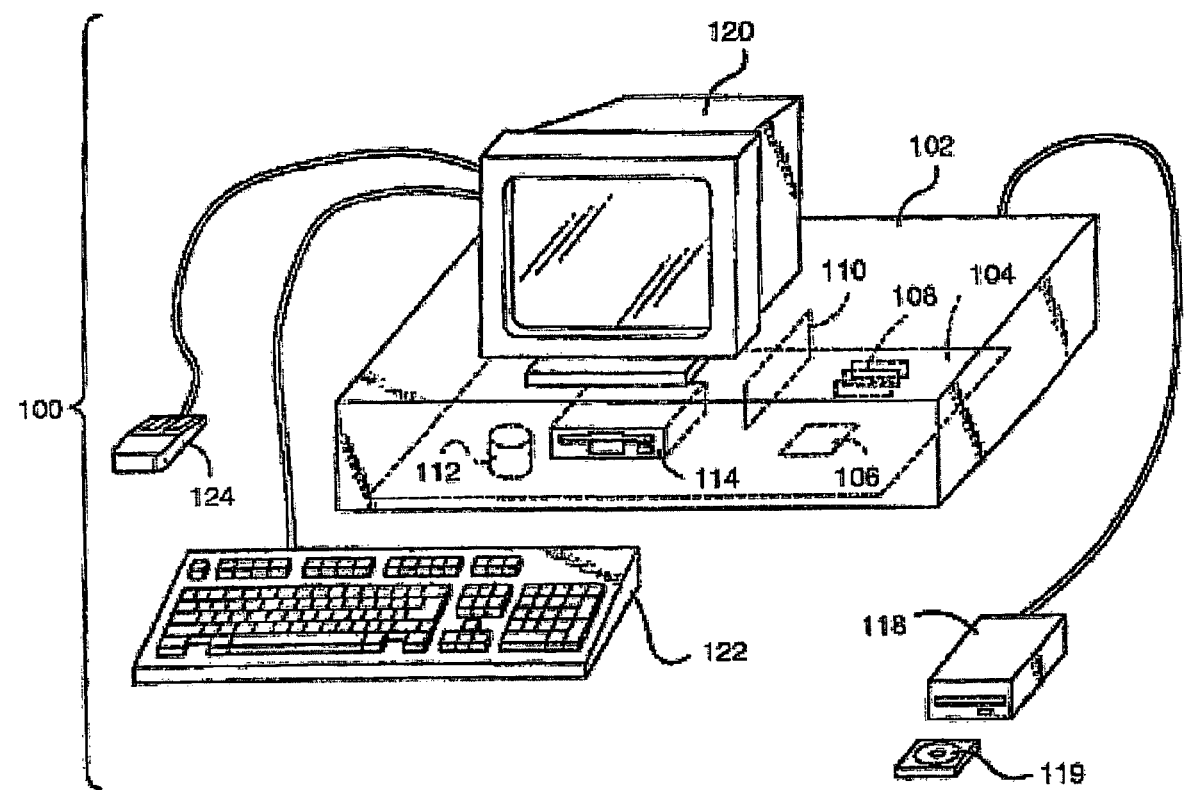
FIG. 8 is a schematic showing a computer system for controlling the temperature of the electrode.

In any of the above-described embodiments, the power delivered to individual zones Z1–Z5 may be independently controlled by commands accepted from a centralized computer 100, as shown in FIGS. 7 and 8. Referring to FIG. 7, the computer 100 can be employed to control other functions and can communicate with a control processor 20.

In turn, the control processor 20 commands the DC power level output from the DC power supply 21. In one embodiment of the present invention, an RF choke or filter 22 is inserted between the DC power supply 21 and the resistive heater elements 1 so as to isolate the DC power supply 21 from the applied RF signals supplied from the RF power supply 23. Moreover, in yet another embodiment, the match network 24 enables proper RF power matching when generating the plasma. The gas box 25, along with the pump 26 regulate gas flow and pressure within the processing chamber 27.

FIG. 8 illustrates a computer system for communicating with a control processor 20 to command the DC power level output from the DC power supply 21 to the resistive heating elements 1 which are embedded within the plate 2 of the first embodiment of the present invention or recessed in the electrode 4 of the second embodiment of the present invention. The computer system includes a computer 100 to implement the method of the present invention. The computer 100 includes a computer housing 102 which houses the motherboard 104. The motherboard 104 contains a central processing unit (hereinafter "CPU") 106, a memory 108 (e.g., DRAM, ROM, EPROM, EEPROM, SRAM, SDRAM, and Flash RAM), and other optional special purpose logic devices (e.g., ASICs) or configurable logic devices (e.g., GAL and reprogrammable FPGA). The memory 108 stores information for the temperature of the resistive heater elements 1, etc. Preferably, the memory 108 stores information even when the upper electrode housing 3 and the electrode 4 are turned off and not in use.

The computer 100 also includes plural input devices (e.g., a keyboard 122 and mouse 124) and a display card 110 for controlling the monitor 120. In addition, the computer system 100 further includes a floppy disk drive 114; other removable media devices (e.g. compact disc 119, tape, and removable magneto-optical media (not shown)); and a hard disk 112, or other fixed, high density media drives, connected using an appropriate device bus (e.g., a SCSI bus, an Enhanced IDE bus, or an Ultra DMA bus). Also connected to the same device bus or another device bus, the computer 100 may additionally include a compact disc reader 118, a compact disc reader/writer (not shown) or a compact disc jukebox (not shown). Although the compact disc 119 is shown in a CD caddy, the compact disc 119 can be inserted directly into CD-ROM drives which do not require caddies. In addition, a printer (not shown) also provides printed listings of the electrode temperature.

As stated above, the computer system includes at least one computer readable medium. Examples of computer readable media are compact discs 119, hard disks 112, floppy discs, tape, magneto-optical discs, PROMs, (EPROM, EEPROM, Flash EPROM), DRAM, SRAM, SDRAM, etc. Stored on any one or on a combination of computer readable media, the present invention includes software for controlling both the hardware of the computer 100 and for enabling the computer 100 to interact with a human user. Such software may include, but is not limited to, device drivers, operating systems, and user applications, such as development tools. Such computer readable media further includes the computer program product of the present invention for the method of controlling electrode temperature. The computer code devices of the present invention can be any interpreted or executable code mechanism, including but not limit to, scripts, interpreters, dynamic link libraries, Java classes, and complete executable programs.

The first and second embodiments of the present invention and several variations thereof have been described for multi-zone heaters for a single-electrode upper structure. However, the concept is easily extended to a segmented upper electrode, wherein the pattern of resistive heater elements is either segmented per each sub-electrode, embedded within a single electrode plate, or embedded within each sub-electrode silicon plate.

Obviously, numerous modifications and variations of the present invention are possible in light of the above teachings. It is therefore understood that, within the scope of the appended claims, the present invention may be practiced otherwise than as specifically described herein.

The invention claimed is:

1. A plasma processing system comprising:
a process chamber;
a substrate holder provided in a substrate region of the process chamber; and
an upper electrode assembly provided within the process chamber opposing the substrate holder, the upper electrode assembly comprising:
an electrode housing having an RF transmission feed
an electrode coupled to the electrode housing, and
at least one resistive heater element thermally coupled to the electrode to provide temperature uniformity of the electrode.

2. The plasma processing system of claim 1, wherein said electrode comprises silicon.

3. The plasma processing system of claim 1, further comprising a plate being affixed to the electrode housing and having said at least one resistive heater element integrated therein.

4. The plasma processing system of claim 3, wherein said plate comprises quartz.

5. The plasma processing system of claim 4, wherein the electrode housing further comprises a bottom surface recess configured to receive said quartz plate, and at least one convex bottom surface.

6. The plasma processing system of claim 5, wherein the quartz plate comprises at least one convex bottom surface.

7. The plasma processing system of claim 2, wherein the electrode comprises a flat top surface.

8. The plasma processing system of claim 2, wherein the electrode comprises a slightly convex bottom surface.

9. The plasma processing system of claim 2, wherein the at least one resistive heater element comprises a plurality of zones.

10. The plasma processing system of claim 9, wherein the plurality of zones comprise four outer zones forming an outer cross-sectional periphery of said silicon electrode and a fifth inner zone located substantially internally of said four outer zones.

11. The plasma processing system of claim 9, wherein the plurality of zones comprise at least three concentric ring heating elements.

12. The plasma processing system of claim 10, wherein at least one zone of said plurality of zones comprises resistive heater elements formed into an undulating pattern.

13. The plasma processing system of claim 1, further comprising an electrical conduit through the RF transmission feed.

14. The plasma processing system of claim 13, further comprising at least one wire through the electrical conduit.

15. The plasma processing system of claim 1, further comprising a gas conduit through the RF transmission feed.

16. The plasma processing system of claim 15, wherein the gas conduit leads to gas orifices located through a thickness of the plate.

17. The plasma processing system of claim 4, wherein said resistive heater elements are embedded within the quartz plate so that quartz material between the at least one resistive heater element insulates plural resistive heater elements from each other.

18. The plasma processing system of claim 4, wherein the housing includes at least one gas baffle plate separating the quartz plate from an inner surface of the housing.

19. A silicon electrode comprising a silicon electrode plate configured to be connected to an upper electrode assembly; and:

a plurality of resistive heaters embedded within the silicon electrode plate so that a top surface of at least one resistive heater element is substantially flush with a top surface of said silicon electrode plate.

20. The silicon electrode of claim 19, wherein said top surface of said electrode plate comprises a silicon-oxide layer thereon which has been etched so that there are openings in said silicon-oxide layer corresponding to locations above the plurality of resistive heater elements.

21. The silicon electrode of claim 19, wherein the at least one resistive heater element comprises elements of at least one of a P-type and an N-type.

22. The silicon electrode of claim 20, further comprising an electrode housing coupled to said silicon electrode plate.

23. A method of controlling a temperature of a silicon electrode connected to an RF transmission feed, said method comprising the steps of:
embedding at least one resistive heater element within a silicon electrode coupled to an upper electrode of a processing chamber; and
driving a current through the at least one resistive heater element.

24. The method of claim 23, further comprising forming a silicon-oxide layer on top of the silicon electrode.

25. The method of claim 24, further comprising forming a silicon-oxide layer approximately 1 micrometer thick on top of the silicon electrode.

26. The method of claim 23, wherein the step of embedding comprises patterning the at least one resistive heater element.

27. The method of claim 26, wherein said patterning step comprises etching a pattern using a mask.

28. The method of claim 24, further comprising forming metallic contacts in diffused regions to provide for application of DC power to said at least one resistive heater element.

* * * * *